United States Patent
Lee et al.

(10) Patent No.: US 12,211,803 B2
(45) Date of Patent: Jan. 28, 2025

(54) SEMICONDUCTOR DEVICE AND METHOD OF FORMING SEMICONDUCTOR PACKAGE WITH RF ANTENNA INTERPOSER HAVING HIGH DIELECTRIC ENCAPSULATION

(71) Applicant: STATS ChipPAC Pte. Ltd., Singapore (SG)

(72) Inventors: HunTeak Lee, Gyeongi-do (KR); Gwang Kim, Gyeongi-do (KR); Junho Ye, Seoul (KR); YouJoung Choi, Gyeonggi-do (KR); MinKyung Kim, Incheon (KR); Yongwoo Lee, Incheon (KR); Namgu Kim, Incheon (KR)

(73) Assignee: STATS ChipPAC Pte. Ltd., Singapore (SG)

(*) Notice: Subject to any disclaimer, the term of this patent is extended or adjusted under 35 U.S.C. 154(b) by 0 days.

(21) Appl. No.: 18/390,051

(22) Filed: Dec. 20, 2023

(65) Prior Publication Data
US 2024/0128201 A1 Apr. 18, 2024

Related U.S. Application Data

(63) Continuation of application No. 17/447,336, filed on Sep. 10, 2021, now Pat. No. 11,894,314.

(51) Int. Cl.
*H01L 23/52* (2006.01)
*H01L 21/56* (2006.01)
(Continued)

(52) U.S. Cl.
CPC ............ *H01L 23/552* (2013.01); *H01L 21/56* (2013.01); *H01L 23/3128* (2013.01);
(Continued)

(58) Field of Classification Search
CPC ... H01L 23/552; H01L 21/56; H01L 23/3128; H01L 23/49822; H01Q 1/40
See application file for complete search history.

(56) References Cited

U.S. PATENT DOCUMENTS

| 6,150,456 A | 11/2000 | Lee et al. |
| 11,587,916 B2* | 2/2023 | Wang ............... H01L 21/6836 |

(Continued)

FOREIGN PATENT DOCUMENTS

| CN | 110061345 A | 7/2019 |
| JP | 11-106650 | 4/2020 |

*Primary Examiner* — Nicholas J Tobergte
(74) *Attorney, Agent, or Firm* — Robert D. Atkins; PATENT LAW GROUP: Atkins and Associates, P.C.

(57) ABSTRACT

A semiconductor device has a substrate and an electrical component disposed over a surface of the substrate. An antenna interposer is disposed over the substrate. A first encapsulant is deposited around the antenna interposer. The first encapsulant has a high dielectric constant. The antenna interposer has a conductive layer operating as an antenna and an insulating layer having a low dielectric constant less than the high dielectric constant of the first encapsulant. The antenna interposer is made from an antenna substrate having a plurality of antenna interposers. Bumps are formed over the antenna substrate and the antenna substrate is singulated to make the plurality of antenna interposers. A second encapsulant is deposited over the electrical component. The second encapsulant has a low dielectric constant less than the high dielectric constant of the first encapsulant. A shielding layer is disposed over the second encapsulant.

22 Claims, 15 Drawing Sheets

(51) Int. Cl.
   *H01L 23/31*     (2006.01)
   *H01L 23/498*    (2006.01)
   *H01L 23/552*    (2006.01)
   *H01L 23/64*     (2006.01)
   *H01L 23/66*     (2006.01)
   *H01Q 1/24*      (2006.01)
   *H01Q 1/40*      (2006.01)

(52) U.S. Cl.
   CPC .. *H01L 23/49816* (2013.01); *H01L 23/49822* (2013.01); *H01L 23/645* (2013.01); *H01L 23/66* (2013.01); *H01Q 1/243* (2013.01); *H01Q 1/40* (2013.01); *H01L 2223/6677* (2013.01)

(56)                References Cited

U.S. PATENT DOCUMENTS

| | | | |
|---|---|---|---|
| 2004/0212544 A1* | 10/2004 | Pennaz | G06K 19/07786 |
| | | | 257/E23.064 |
| 2009/0302439 A1 | 12/2009 | Pagaila et al. | |
| 2016/0218072 A1 | 7/2016 | Liao et al. | |
| 2017/0346185 A1 | 11/2017 | Wang et al. | |
| 2019/0035749 A1 | 1/2019 | Dalmia et al. | |
| 2019/0221917 A1 | 7/2019 | Kim et al. | |
| 2020/0135669 A1* | 4/2020 | Liang | H01L 24/20 |
| 2020/0161252 A1* | 5/2020 | Yang | H01L 21/561 |
| 2020/0295453 A1* | 9/2020 | Kuo | H01L 23/3128 |
| 2021/0091017 A1* | 3/2021 | Yeon | H01L 24/16 |
| 2022/0148983 A1* | 5/2022 | Lee | H01L 23/5386 |

\* cited by examiner

SEMICONDUCTOR DEVICE AND METHOD OF FORMING SEMICONDUCTOR PACKAGE WITH RF ANTENNA INTERPOSER HAVING HIGH DIELECTRIC ENCAPSULATION

CLAIM OF DOMESTIC PRIORITY

The present application is a continuation of U.S. patent application Ser. No. 17/447,336, now U.S. Pat. No. 11,894,314, filed Sep. 10, 2021, which application is incorporated herein by reference.

FIELD OF THE INVENTION

The present invention relates in general to semiconductor devices and, more particularly, to a semiconductor device and method of forming semiconductor package with an RF antenna interposer having a high dielectric constant encapsulation.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particular in high frequency applications such as radio frequency (RF) wireless communications, often contain one or more integrated passive devices (IPDs) to perform necessary electrical functions, such as RF signal processing. The semiconductor devices must be connected to an RF antenna to transmit and receive the RF signals. The RF antenna can be located external to the semiconductor device, e.g., on a PCB. Alternatively, the RF antenna can be integrated in the semiconductor package. The integrated RF antenna is typically embedded with the semiconductor package and/or occupies a relatively small area of the package. The integrated RF antennas known in the prior art lack in RF transmission and reception performance and quality. In particular, the number of substrate layers has been continuously increased for multi-function integration and signal in/out stability in high speed devices, such as antenna on package (AoP). The higher number of substrate layers increases manufacturing cost and lead time. The higher number of substrate layers can induce warpage and introduce defects to lower yield and reliability.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
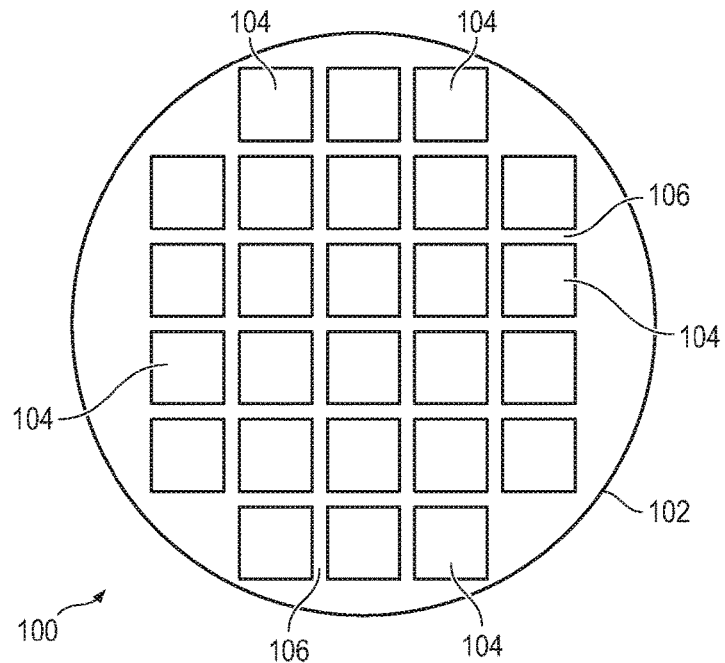
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
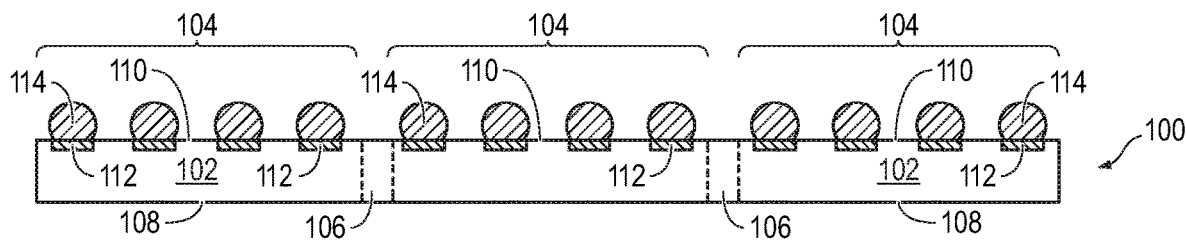

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit.

Semiconductor die 104 may also contain IPDs, such as inductors, capacitors, and resistors, and other circuits for RF signal processing. Surface 108 can undergo backgrinding to planarize semiconductor die 104.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
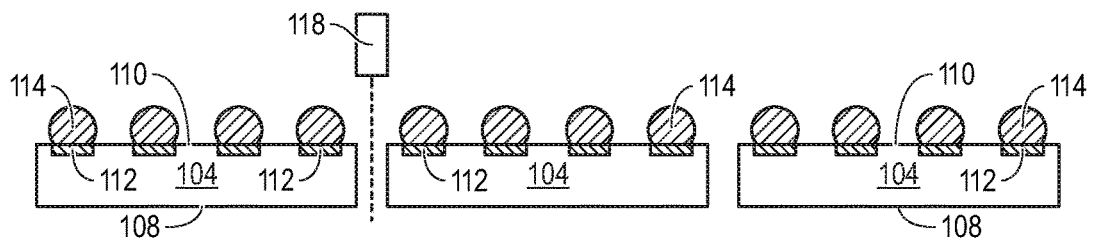

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
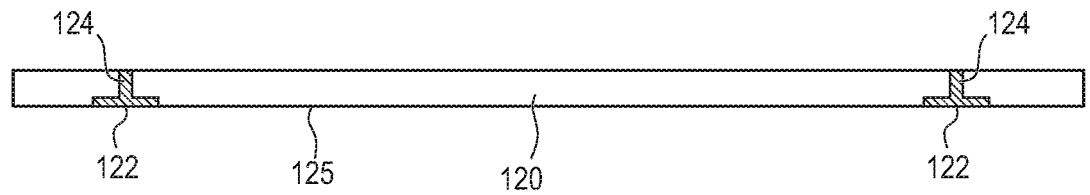
FIGS. 2a-2h illustrate a process of forming an RF antenna interposer substrate having a high dielectric constant encapsulation.

FIGS. 2a-2h illustrate a process of forming an RF antenna interposer substrate having a high dielectric constant encapsulation. In FIG. 2a, insulating layer 120 contains one or more layer of silicon dioxide (SiO2), silicon nitride (Si3N4), silicon oxynitride (SiON), tantalum pentoxide (Ta2O5), aluminum oxide (Al2O3), solder resist, polymer, polytetrafluoroethylene (PTFE) pre-impregnated (prepreg), polyimide, benzocyclobutene (BCB), polybenzoxazoles (PBO), and other material having similar insulating and structural properties. Conductive layer 122 is formed over surface 125 of insulating layer 120. Conductive layer 122 can be one or more layers of Al, Cu, Sn, Ni, Au, Ag, or other suitable electrically conductive material. Conductive layer 122 provides horizontal electrical interconnect across insulating layer 120, including surface 125. A plurality of vias is formed through insulating layer 120 by etching, drilling, or LDA. The vias are filled with conductive material to form conductive vias 124 for vertical electrical interconnect through insulating layer 120 to conductive layer 122.

Figure 2B:
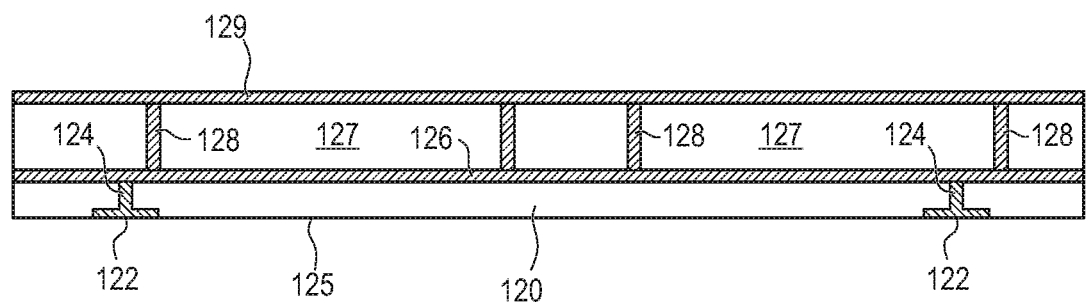

In FIG. 2b, conductive layer 126 is formed over insulating layer 120 and electrically connected to conductive via 124. Conductive layer 126 can be one or more layers of Al, Cu, Sn, Ni, Au, Ag, or other suitable electrically conductive material. Conductive layer 126 provides horizontal electrical interconnect across insulating layer 120. An insulating layer 127 is formed over conductive layer 126. Insulating layer 127 contains one or more layers of SiO2, Si3N4, SiON, Ta2O5, Al2O3, solder resist, prepreg, polyimide, polymer, BCB, PBO, and other material having similar insulating and structural properties. A plurality of vias is formed through insulating layer 127 by etching, drilling, or LDA. The vias are filled with conductive material to form conductive vias 128 for vertical electrical interconnect through insulating layer 127 to conductive layer 126. Conductive layer 129 is formed over insulating layer 127 and electrically connected to conductive via 128. Conductive layer 129 can be one or more layers of Al, Cu, Sn, Ni, Au, Ag, or other suitable electrically conductive material. In one embodiment, conductive layer 129 provides a ground plane and horizontal electrical interconnect across insulating layer 127.

Figure 2C:
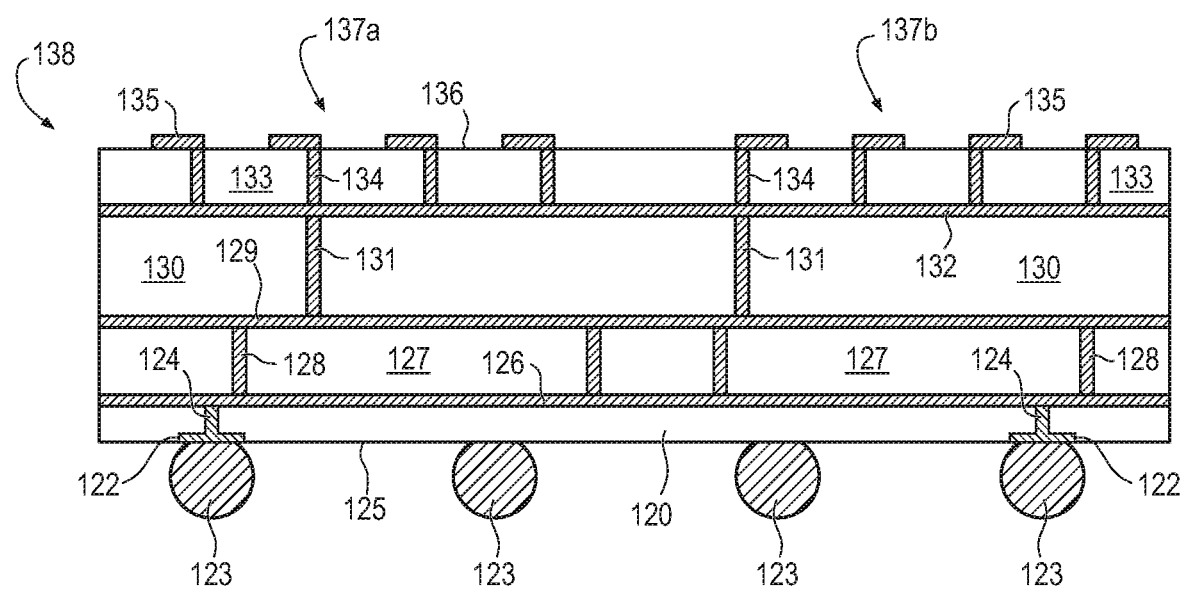

In FIG. 2c, insulating layer 130 is formed over conductive layer 129. Insulating layer 130 contains one or more layers of SiO2, Si3N4, SiON, Ta2O5, Al2O3, solder resist, prepreg, polyimide, polymer, BCB, PBO, and other material having similar insulating and structural properties. A plurality of vias is formed through insulating layer 130 by etching, drilling, or LDA. The vias are filled with conductive material to form conductive vias 131 for vertical electrical interconnect through insulating layer 130 to conductive layer 129. Conductive layer 132 is formed over insulating layer 130 and electrically connected to conductive via 131. Conductive layer 132 can be one or more layers of Al, Cu, Sn, Ni, Au, Ag, or other suitable electrically conductive material. Conductive layer 132 provides horizontal electrical interconnect across insulating layer 130. Conductive layer 132 can be configured as an RF antenna, similar to RF antenna 137, embedded within RF antenna interposer substrate 138. An insulating layer 133 is formed over conductive layer 132. Insulating layer 133 contains one or more layers of SiO2, Si3N4, SiON, Ta2O5, Al2O3, solder resist, prepreg, polyimide, polymer, BCB, PBO, and other material having similar insulating and structural properties. A plurality of vias is formed through insulating layer 133 by etching, drilling, or LDA. The vias are filled with conductive material to form conductive vias 134 for vertical electrical interconnect through insulating layer 133 to conductive layer 132. Conductive layer 135 is formed over surface 136 of insulating layer 133 and electrically connected to conductive via 134. Conductive layer 135 can be one or more layers of Al, Cu, Sn, Ni, Au, Ag, or other suitable electrically conductive material. Conductive layer 135 operates as multiple RF antenna 137a-137b exposed from surface 136 of RF antenna interposer substrate 138. In one embodiment, RF antenna interposer substrate 138 has eight or more conductive layers like 126, 129, 132, and 135 separated by insulating layers like 120, 127, 130, and 133. The smaller number of conductive layers reduces manufacturing cost and lead time, while managing warpage with lower product height and minimizing other product defects. Insulating layers 120, 127, 130, and 133 have a low dielectric constant (Dk) and low dielectric factor (Df). For example, insulating layers 120, 127, 130, and 133 have Dk of 3.2-3.7 and Df of 0.002~0.007 at 1 GHz and 0.003~0.008 at 10 GHz.

An electrically conductive bump material is deposited over conductive layer 122 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 122 using a suitable attachment or bonding process. In one embodiment, the bump material is reflowed by heating the material above its melting point to form balls or bumps 123. In one embodiment, bump 123 is formed over a UBM having a wetting layer, barrier layer, and adhesive layer. Bump 123 can also be compression bonded or thermocompression bonded to conductive layer 122. In one embodiment, bump 123 is a copper core bump for durability and maintaining its height. Bump 123 represents one type of interconnect structure that can be formed over conductive layer 122. The interconnect structure can also use bond wires, conductive paste, stud bump, micro bump, or other electrical interconnect.

Figure 2D:
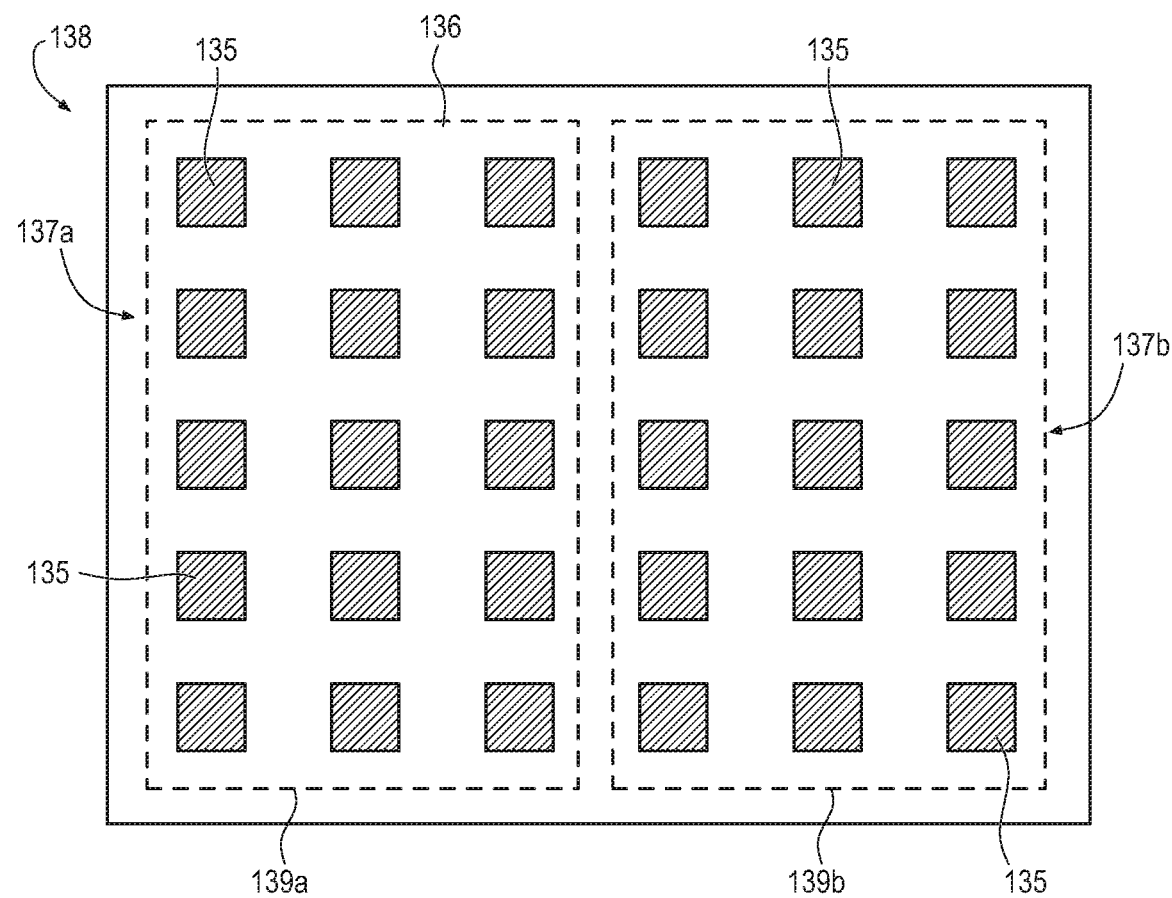

FIG. 2d is a top view of RF antenna interposer substrate 138. Conductive layer 135 includes an array of islands of conductive material in the form of conductive layer 135 suitable to provide transmission and reception of RF signals, i.e., an RF antenna. In particular, the array of islands of conductive layer 135 are exposed from surface 136 to improve RF transmission and reception performance and quality. In one embodiment, a first group of islands of conductive material 139a serves as a first antenna 137a electrically connected through conductive layers 122, 126, 129, 132 and conductive vias 124, 128, 131, 134 and bumps 123 to provide RF transmission and reception for a first electrical component. A second group of islands of conductive material 139b serves as a second antenna 137b electrically connected through conductive layers 122, 126, 129, 132 and conductive vias 124, 128, 131, 134 and bumps 123 to provide RF transmission and reception for a second electrical component. Although two RF antennas 137a-137b are shown in FIGS. 2d-2e for purposes of a simplified description, RF antenna substrate 138 can have any number of RF antenna interposers 140.

Figure 2E:
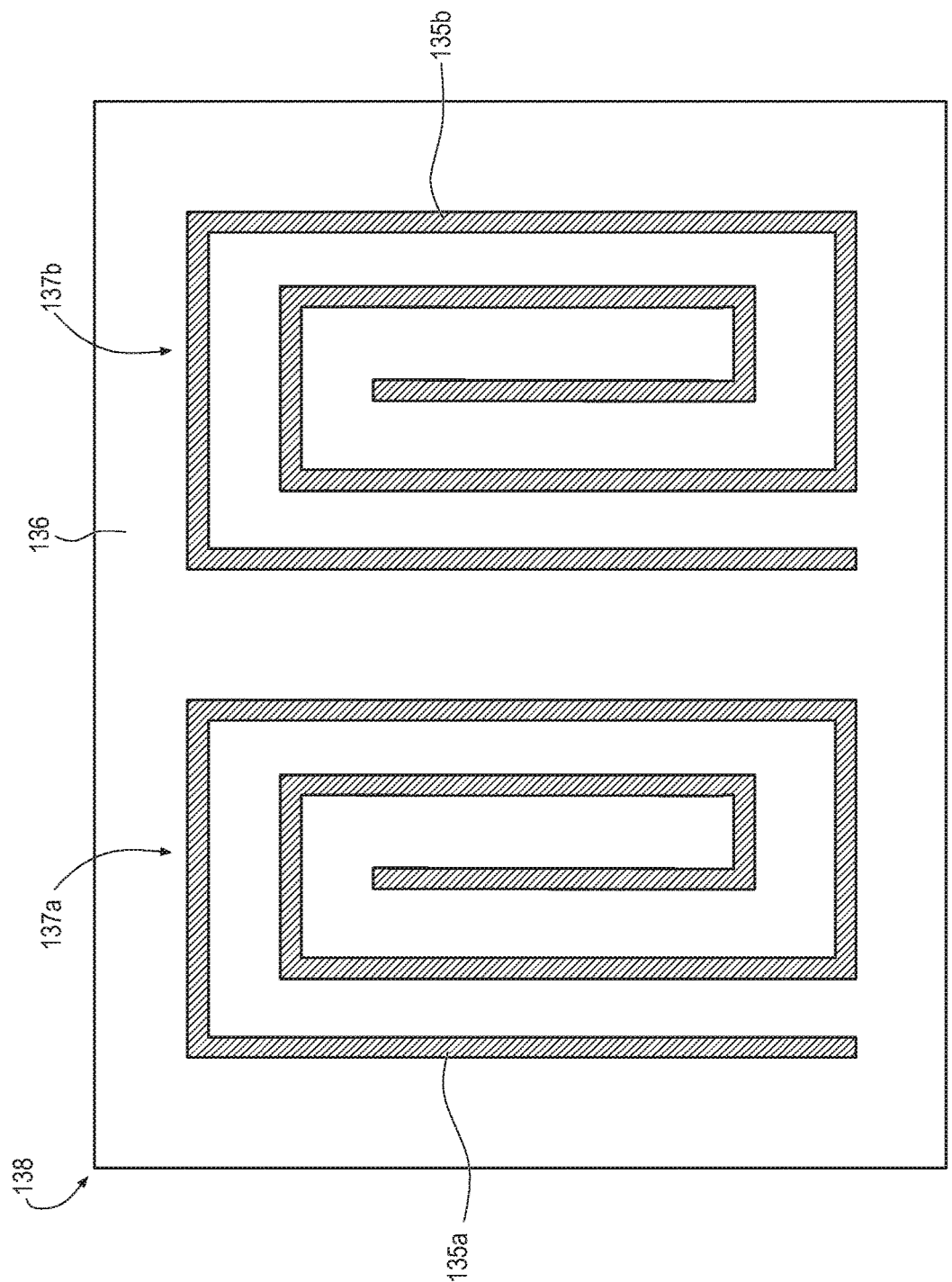

FIG. 2e is a top view of another embodiment of RF antenna interposer substrate 138. Conductive layer 135 includes a plurality of spiral shapes of conductive material suitable to provide transmission and reception of RF signals. In particular, the spiral shapes of conductive layer 135 are exposed from surface 136 to improve RF transmission and reception performance and quality. In one embodiment, conductive layer 135a serves as a first spiral-shaped RF antenna 137a electrically connected through conductive layers 122, 126, 129, 132 and conductive vias 124, 128, 131, 134 and bumps 123 to provide RF transmission and reception for a first electrical component. Conductive layer 135b serves as a second spiral-shaped RF antenna 137b electrically connected through conductive layers 122, 126, 129, 132 and conductive vias 124, 128, 131, 134 and bumps 123 to provide RF transmission and reception for a second electrical component.

Figure 2F:
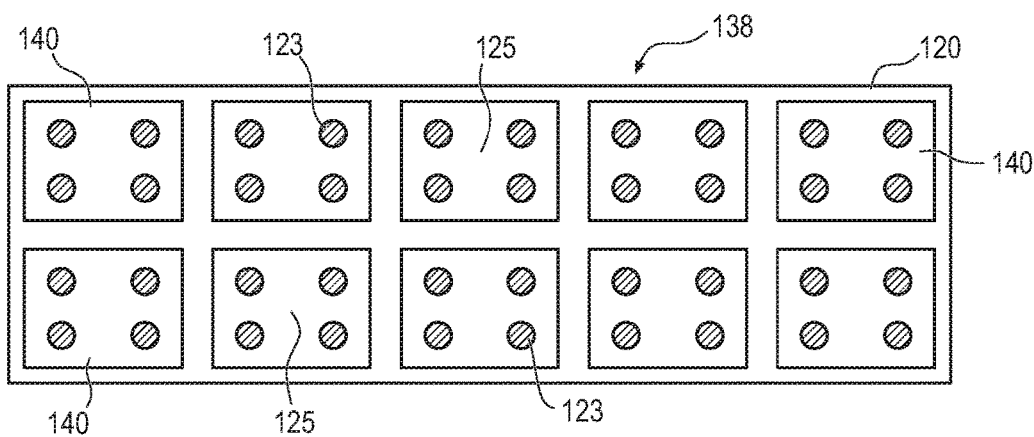

FIG. 2f shows a top view of RF antenna interposer substrate 138 with RF antenna interposers 140 and bumps 123 formed on surface 125 using sold ball mount (SBM).

Figure 2G:
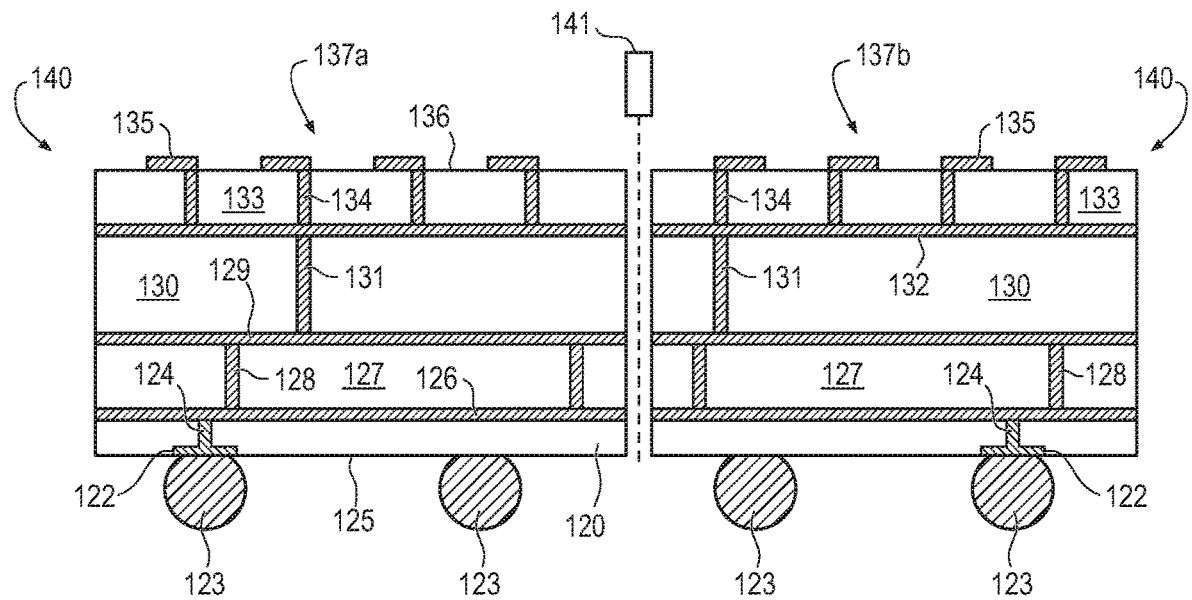
Figure 2H:
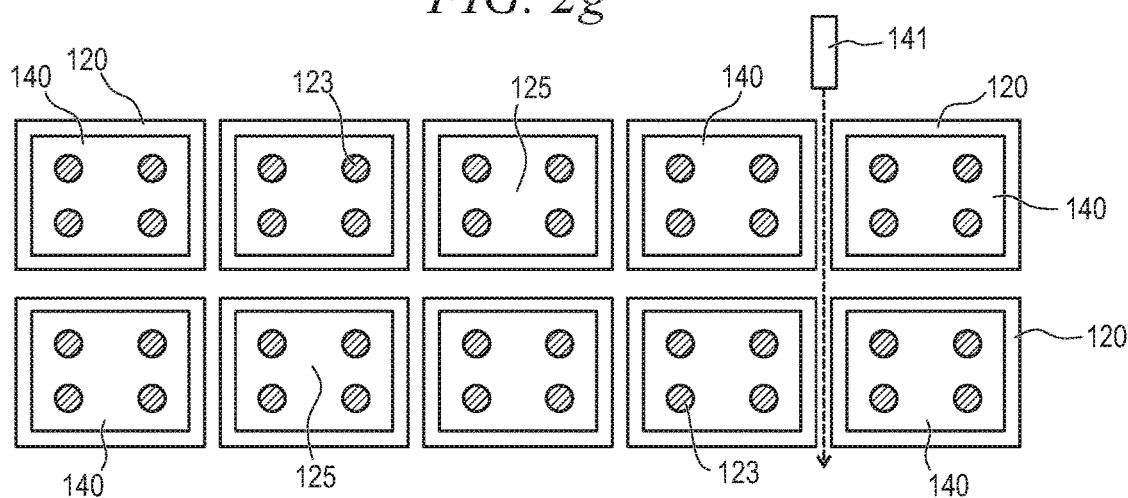

In FIG. 2g, RF antenna interposer substrate 138 is singulated using a saw blade or laser cutting tool 141 into discrete RF antenna interposers 140. Discrete RF antenna interposers 140 can be loaded on tape and reel for later assembly. FIG. 2h shows a top view of discrete RF antenna interposers 140 with bumps 123 post singulation.

Figure 3A:
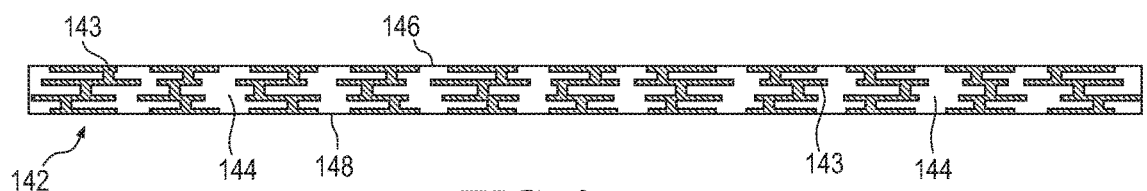
FIGS. 3a-3h illustrate a process of forming a semiconductor package with semiconductor die, interconnect substrate, and RF antenna interposer.

FIGS. 3a-3h illustrate a process of forming a semiconductor package with electrical components and interconnect substrate and discrete RF antenna interposers. FIG. 3a shows a cross-sectional view of interconnect substrate or PCB 142 including conductive layers 143 and insulating layer 144. Conductive layer 143 can be one or more layers of Al, Cu, Sn, Ni, Au, Ag, or other suitable electrically conductive material. Conductive layer 143 can be formed by solder paste printing or flux printing. Conductive layer 143 provides horizontal electrical interconnect across substrate 142 and vertical electrical interconnect between top surface 146 and bottom surface 148 of substrate 142. Portions of conductive layer 143 can be electrically common or electrically isolated depending on the design and function of the electrical components. Insulating layer 144 contains one or more layers of $SiO_2$, $Si_3N_4$, SiON, $Ta_2O_5$, $Al_2O_3$, solder resist, prepreg, polyimide, polymer, BCB, PBO, and other material having similar insulating and structural properties. Insulating layer 144 provides isolation between conductive layers 143. In one embodiment, interconnect substrate 142 has eight or more conductive layers 143 separated by insulating layers 144. Insulating layers 144 have a low Dk and low Df. For example, insulating layers 144 has Dk of 3.2-3.7 and Df of 0.002~0.007 at 1 GHz and 0.003~0.008 at 10 GHz.

Figure 3B:
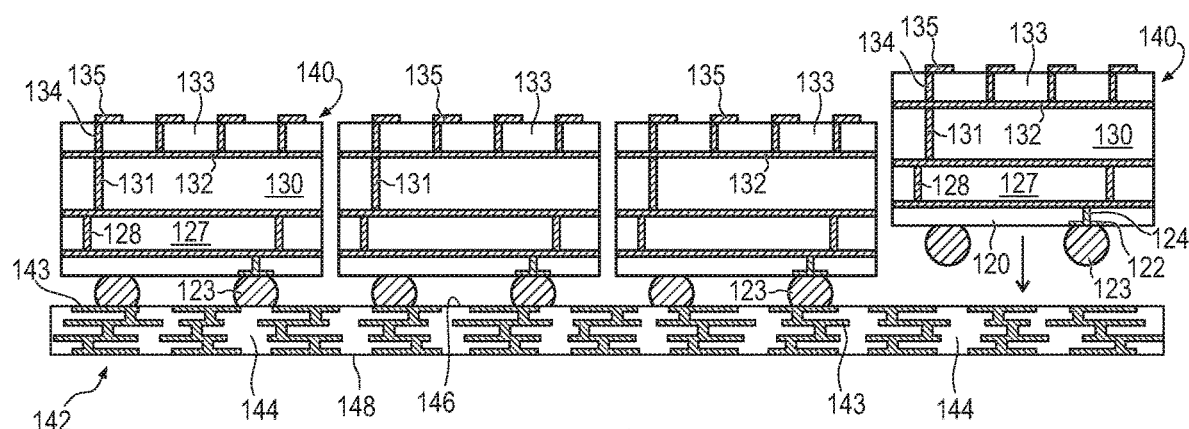
Figure 3C:
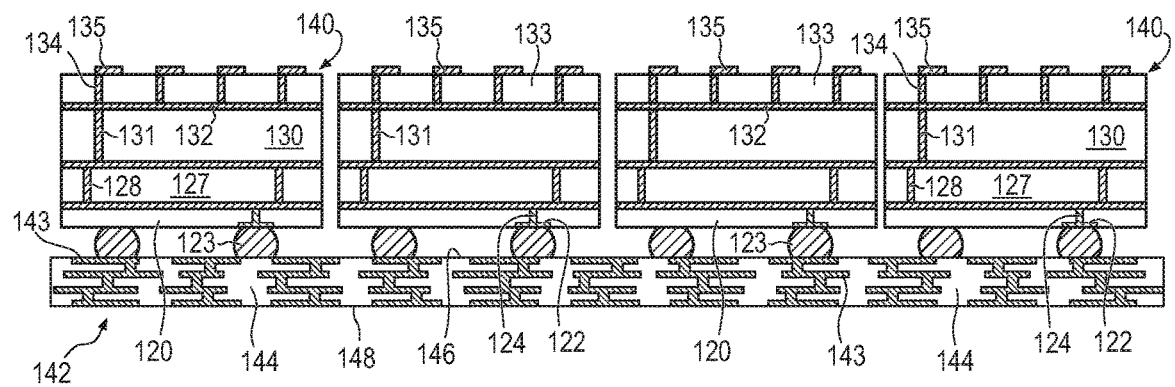

In FIG. 3b, discrete RF antenna interposers 140 from FIG. 2a-2h are positioned over substrate 142 using a pick and place operation with bumps 123 oriented toward surface 146. Discrete RF antenna interposers 140 can be mounted using the previously mentioned tape and real. FIG. 3c shows discrete RF antenna interposers 140 mounted to interconnect substrate 142 with bumps 123 making mechanical and electrical connection to conductive layer 143.

Figure 3D:
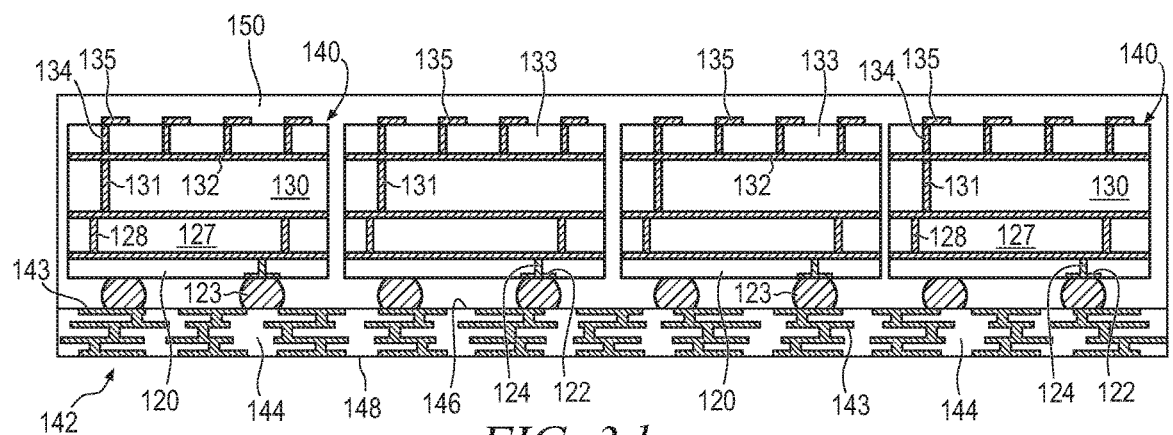

In FIG. 3d, an encapsulant or molding compound 150 is deposited over discrete RF antenna interposers 140 and surface 146 of interconnect substrate 142 using a paste printing, compressive molding, transfer molding, liquid encapsulant molding, vacuum lamination, spin coating, or other suitable applicator. Encapsulant 150 can be polymer composite material, such as epoxy resin with filler, epoxy acrylate with filler, or polymer with proper filler. Encapsulant 150 is non-conductive, provides structural support, and environmentally protects the semiconductor device from external elements and contaminants. Encapsulant 150 has a high Dk and low Df. For example, encapsulant 150 has Dk of 14-21 and Df of 0.006-0.012 at 25 GHz. The higher Dk of encapsulant 150 is greater than the lower Dk of insulating layers 120, 127, 130, 133, and 144.

Figure 3E:
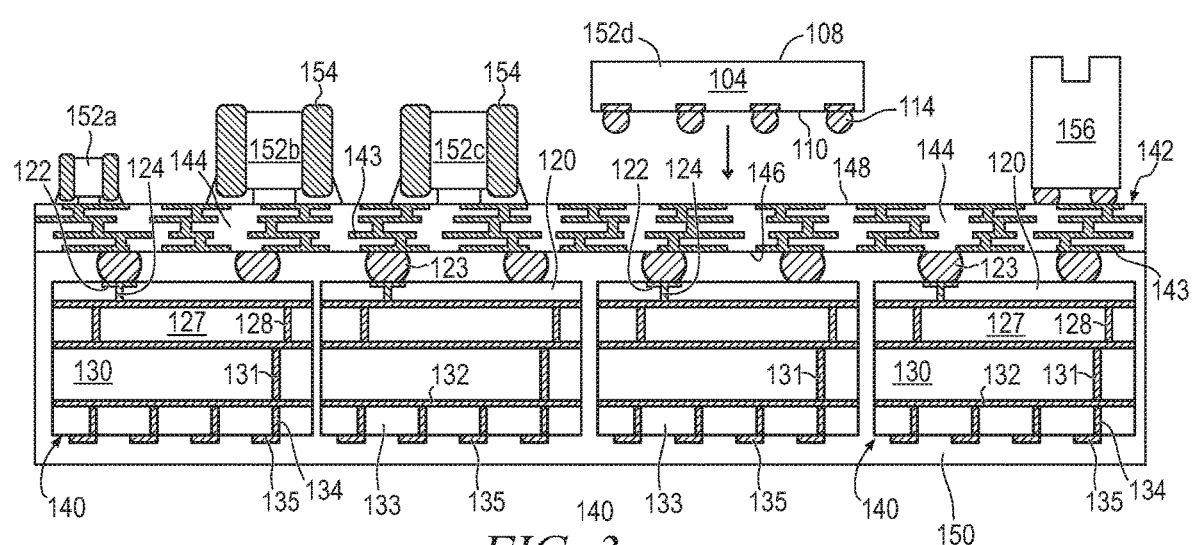
Figure 3F:
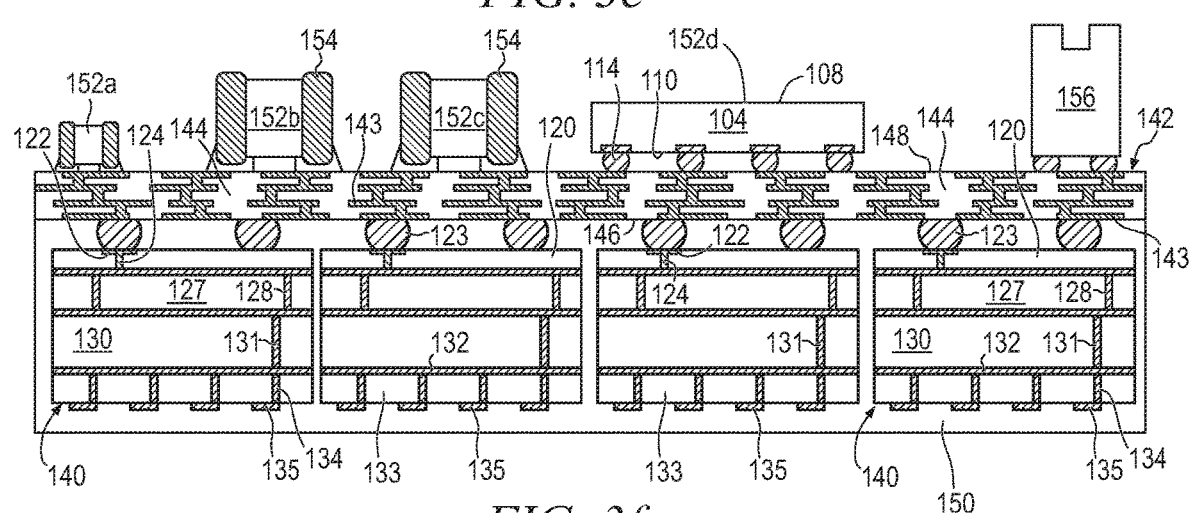

In FIG. 3e, the structure from FIG. 3d is inverted and electrical components 152a-152d are positioned over substrate 142 using a pick and place operation. Electrical components 152a-152d can be a discrete transistor, diode, or IPD. Electrical components 152a-152d can also be a semiconductor die, semiconductor package, surface mount device, or other electrical device. For example, electrical component 152d can be semiconductor die 104 from FIG. 1c with active surface 110 and bumps 114 oriented toward surface 146 of substrate 142 and electrically connected to conductive layer 143. In one embodiment, electrical components 152a-152d are RF signal processing components. FIG. 3f shows electrical components 152a-152d mounted to interconnect substrate 142 with bumps 114 and terminals 154 making mechanical and electrical connection to conductive layer 143. Connector 156 can be a board to board (B2B) connector.

Figure 3G:
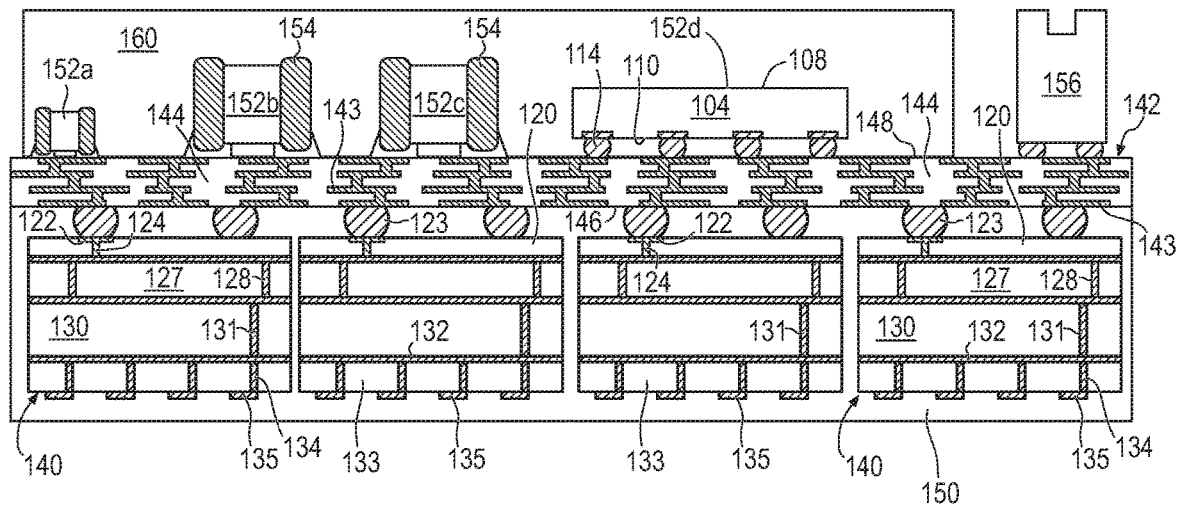

In FIG. 3g, an encapsulant or molding compound 160 is deposited over electrical components 152a-152d and surface 148 of interconnect substrate 142 using a paste printing, compressive molding, transfer molding, liquid encapsulant molding, vacuum lamination, spin coating, or other suitable applicator. Encapsulant 160 can be polymer composite material, such as epoxy resin with filler, epoxy acrylate with filler, or polymer with proper filler. Encapsulant 160 is non-conductive, provides structural support, and environmentally protects the semiconductor device from external elements and contaminants. Encapsulant 160 has a low Dk and low Df. For example, encapsulant 160 has Dk of 3.9 and Df of 0.005 at 25 GHz. In any case, the Dk of encapsulant 160 is less than the Dk of encapsulant 150.

Electrical components 152a-152d may contain IPDs that are susceptible to or generate EMI, RFI, harmonic distortion, and inter-device interference. For example, the IPDs contained within electrical components 152a-152d provide the electrical characteristics needed for high-frequency applications, such as resonators, high-pass filters, low-pass filters, band-pass filters, symmetric Hi-Q resonant transformers, and tuning capacitors. In another embodiment, electrical components 152a-152d contain digital circuits switching at a high frequency, which could interfere with the operation of IPDs in the semiconductor package.

Figure 3H:
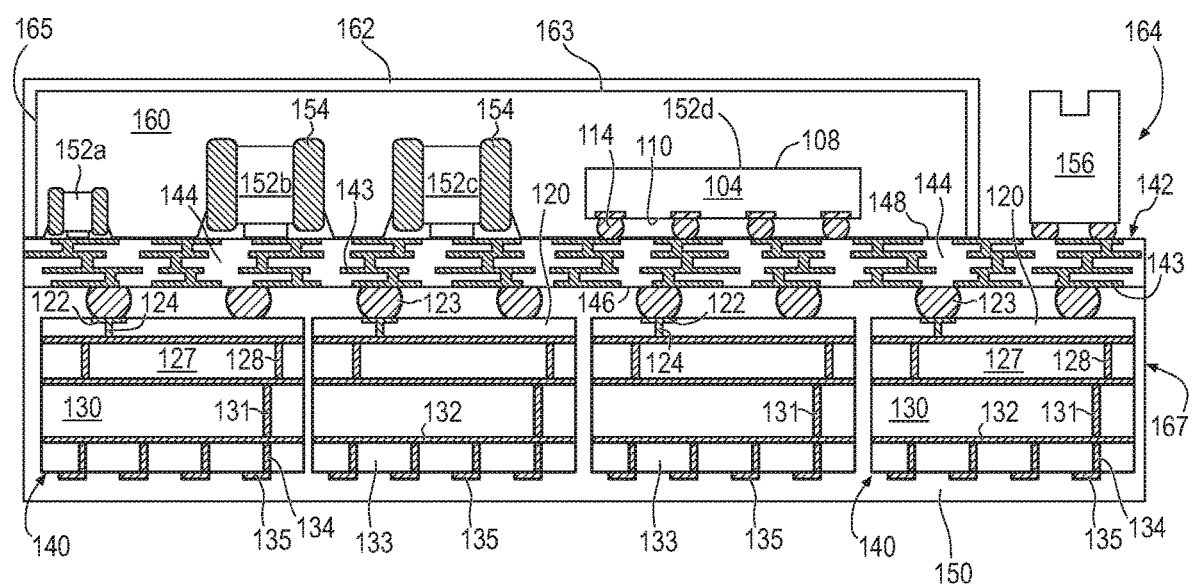

In FIG. 3h, electromagnetic shielding layer 162 is formed or disposed over surface 163 of encapsulant 160 by conformal application of shielding material. Shielding layer 162 can be one or more layers of Al, Cu, Sn, Ni, Au, Ag, or other suitable conductive material. Alternatively, shielding layer 162 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. In addition, shielding layer 162 covers side surfaces 165 of encapsulant 160, as well as the side surface of semiconductor package 164.

Figure 4A:
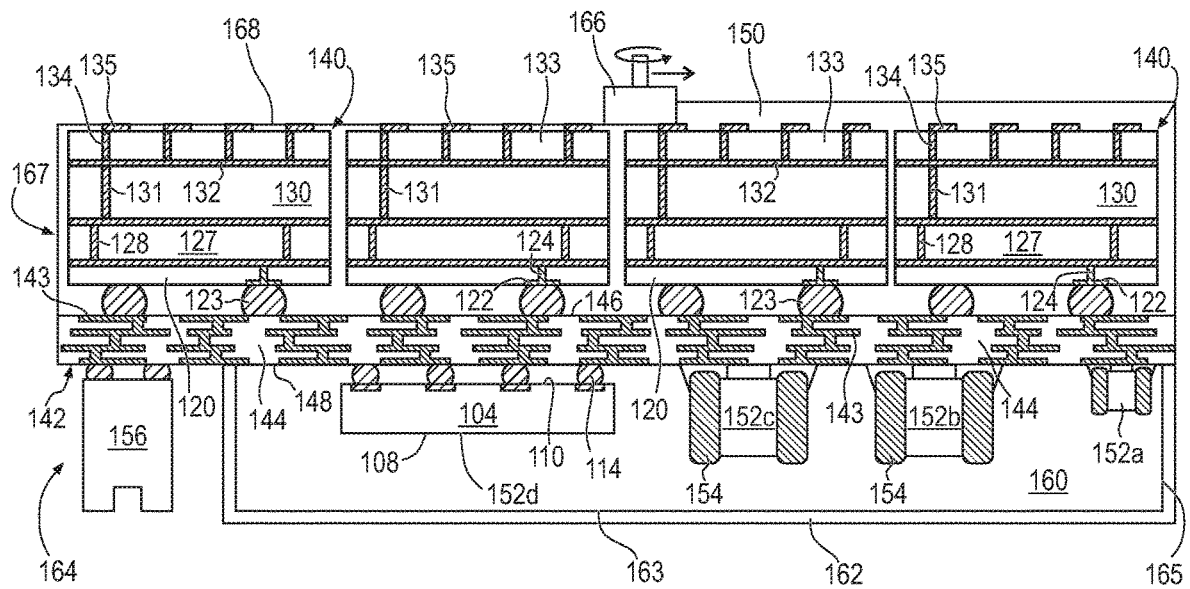
FIGS. 4a-4b illustrate planarizing the RF antenna interposer.
Figure 4B:
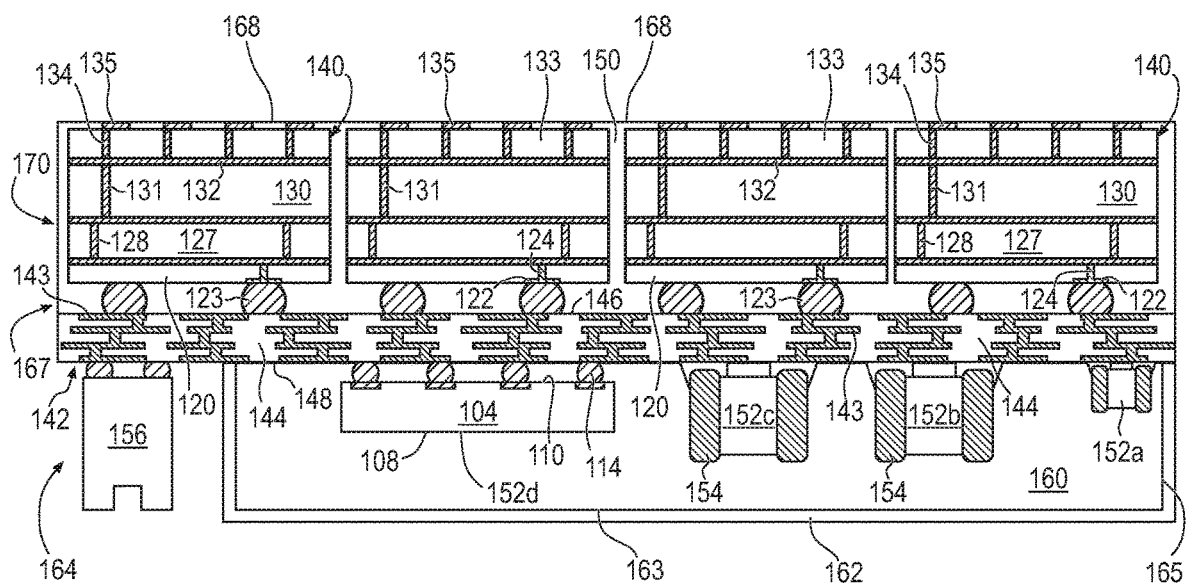

The combination of semiconductor package 164 and discrete RF antenna interposers 140 is designated as AoP 167. As integrated into AoP 167, discrete RF antenna interposers 140 provides the antenna function for RF electrical components 152a-152d in semiconductor package 164. AoP 167 is applicable to 5G/millimeter wave RF products. In one embodiment, a first group of islands of conductive material 139a serves as a first antenna patch 140 electrically connected through conductive layers 122, 126, 129, 132, 143 and conductive vias 124, 128, 131, 134 and bumps 123 to provide RF transmission and reception for a first electrical component 152a-152d in semiconductor package 164. A second group of islands of conductive material 139b serves as a second antenna patch 140 electrically connected through conductive layers 122, 126, 129, 132, 143 and conductive vias 124, 128, 131, 134 and bumps 123 to provide RF transmission and reception for a second electrical component 152a-152d in semiconductor package 164. When configured as an RF antenna, conductive layer 132 can be electrically connected through conductive layers 122, 126, 129, 143 and conductive vias 124, 128, 131 and bumps 123 to provide RF transmission and reception for a third electrical component 152a-152d in semiconductor package 164. Encapsulant 150 deposited around discrete RF antenna interposer 140 has a high Dk and low Df. The higher the value of Dk, the smaller the antenna patch width of conductive layer 135, and more antenna patches can be placed on AoP 167, as shown by equation (1).

$$W = \frac{v_0}{2 * fr} \sqrt{\frac{2}{Dk+1}} \quad (1)$$

where:
W is antenna patch width
$v_0$ is speed of light
fr is resonant frequency
Dk is dielectric constant In another embodiment shown in FIGS. 4a-4b, a portion of encapsulant 150 is removed by grinder 166 to expose surface 168 of encapsulant 150 and discrete RF antenna interposers 140. Grinder 166 planarizes surface 168 of encapsulant 150 and discrete RF antenna interposers 140 in semiconductor package 170, as shown in FIG. 4b.

Figure 5A:
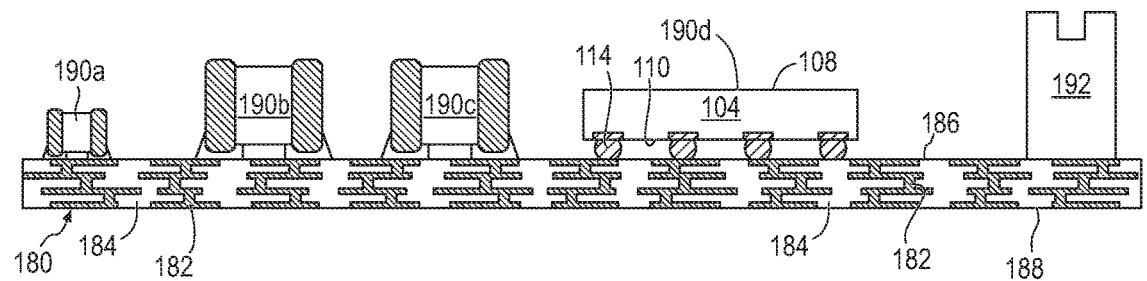
FIGS. 5a-5e illustrate another process of forming a semiconductor package with semiconductor die, interconnect substrate, and RF antenna interposer.

FIGS. 5a-5e illustrate another process of forming a semiconductor package with electrical components and interconnect substrate and discrete RF antenna interposers. FIG. 5a shows a cross-sectional view of interconnect substrate or PCB 180 including conductive layers 182 and insulating layer 184. Conductive layer 182 can be one or more layers of Al, Cu, Sn, Ni, Au, Ag, or other suitable electrically conductive material. Conductive layer 182 can be formed by solder paste printing or flux printing. Conductive layer 182 provides horizontal electrical interconnect across substrate 180 and vertical electrical interconnect between top surface 186 and bottom surface 188 of substrate 180. Portions of conductive layer 182 can be electrically common or electrically isolated depending on the design and function of the electrical components. Insulating layer 184 contains one or more layers of SiO2, Si3N4, SiON, Ta2O5, Al2O3, solder resist, prepreg, polyimide, polymer, BCB, PBO, and other material having similar insulating and structural properties. Insulating layer 184 provides isolation between conductive layers 182. In one embodiment, interconnect substrate 180 has eight or more conductive layers 182 separated by insulating layers 184. Insulating layers 184 have a low Dk and low Df. For example, insulating layers 184 has Dk of 3.2-3.7 and Df of 0.002~0.007 at 1 GHz and 0.003~0.008 at 10 GHz.

Electrical components 190a-190d are positioned over substrate 180 using a pick and place operation, similar to FIGS. 3e-3f. Electrical components 190a-190d can be a discrete transistor, diode, or IPD. Electrical components 190a-190d can also be a semiconductor die, semiconductor package, surface mount device, or other electrical device. For example, electrical component 190d can be semiconductor die 104 from FIG. 1c with active surface 110 and bumps 114 oriented toward surface 186 of substrate 180 and electrically connected to conductive layer 182. In one embodiment, electrical components 190a-190d are RF signal processing components. Connector 192 can be a B2B connector.

Figure 5B:
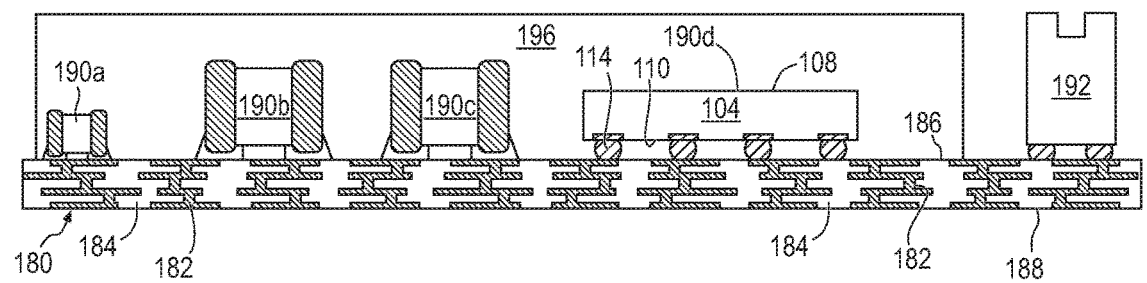

In FIG. 5b, an encapsulant or molding compound 196 is deposited over electrical components 190a-190d and surface 186 of interconnect substrate 180 using a paste printing, compressive molding, transfer molding, liquid encapsulant molding, vacuum lamination, spin coating, or other suitable applicator. Encapsulant 196 can be polymer composite material, such as epoxy resin with filler, epoxy acrylate with filler, or polymer with proper filler. Encapsulant 196 is non-conductive, provides structural support, and environmentally protects the semiconductor device from external elements and contaminants. Encapsulant 196 has a low Dk and low Df. For example, encapsulant 196 has Dk of 3.9 and Df of 0.005 at 25 GHz.

Figure 5C:
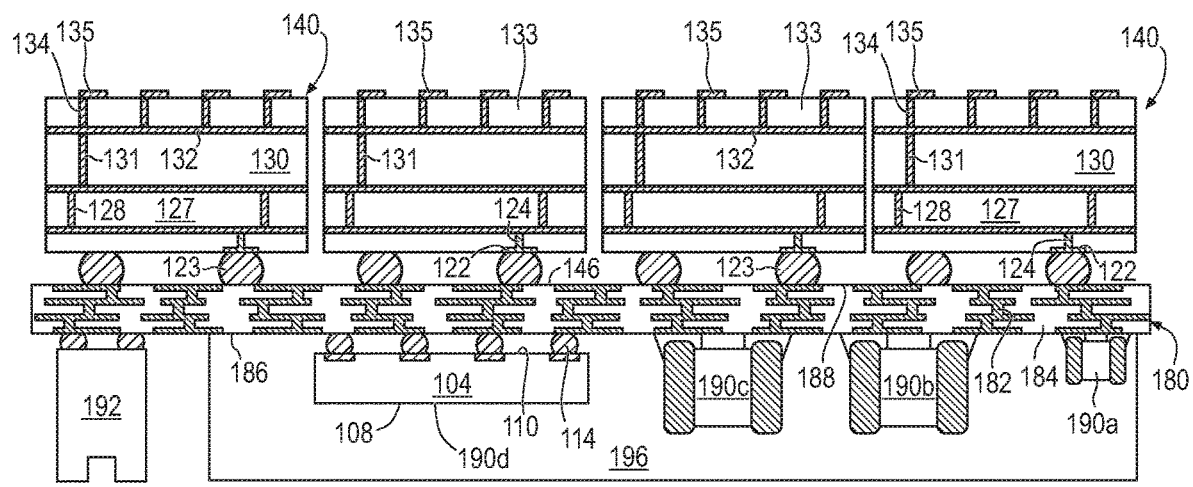

In FIG. 5c, the structure from FIG. 5b is inverted and discrete RF antenna interposers 140 from FIG. 2f are positioned over interconnect substrate 180 using a pick and place operation with bumps 123 oriented toward surface 188, similar to FIGS. 3b-3c. Bumps 123 make mechanical and electrical connection to conductive layer 182.

Figure 5D:
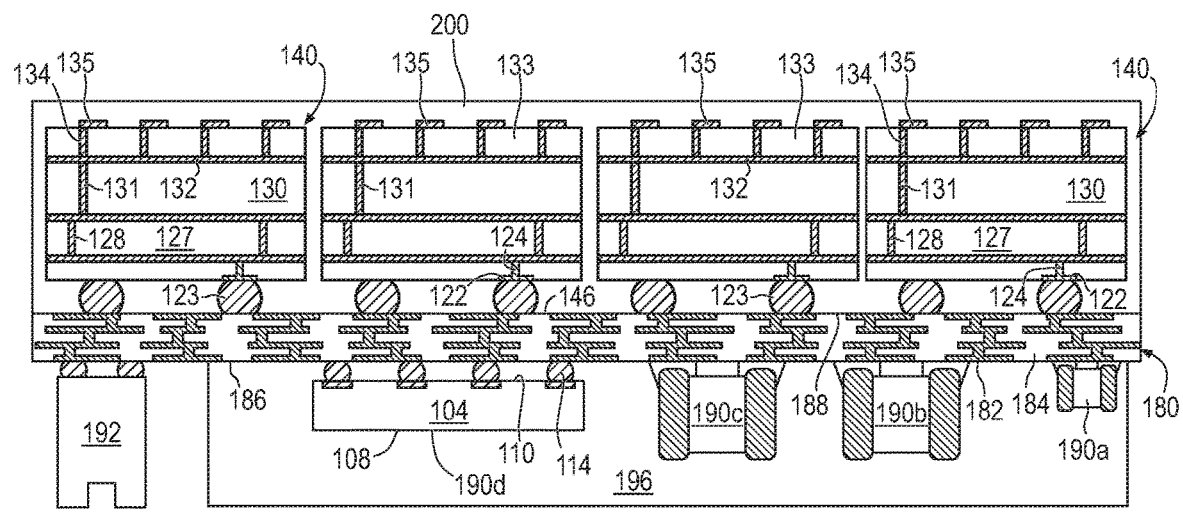

In FIG. 5d, an encapsulant or molding compound 200 is deposited over discrete RF antenna interposers 140 and surface 188 of interconnect substrate 180 using a paste printing, compressive molding, transfer molding, liquid encapsulant molding, vacuum lamination, spin coating, or other suitable applicator. Encapsulant 200 can be polymer composite material, such as epoxy resin with filler, epoxy acrylate with filler, or polymer with proper filler. Encapsulant 200 is non-conductive, provides structural support, and environmentally protects the semiconductor device from external elements and contaminants. Encapsulant 200 has a high Dk and low Df. For example, encapsulant 200 has Dk of 14-21 and Df of 0.006~0.012 at 25 GHz. In any case, the Dk of encapsulant 200 is greater than the Dk of encapsulant 196 and insulating layers 120, 127, 130, and 133, and 144, respectively.

Electrical components 190a-190d may contain IPDs that are susceptible to or generate EMI, RFI, harmonic distortion, and inter-device interference. For example, the IPDs contained within electrical components 190a-190d provide the electrical characteristics needed for high-frequency applications, such as resonators, high-pass filters, low-pass filters, band-pass filters, symmetric Hi-Q resonant transformers, and tuning capacitors. In another embodiment, electrical components 190a-190d contain digital circuits switching at a high frequency, which could interfere with the operation of IPDs in the semiconductor package.

Figure 5E:
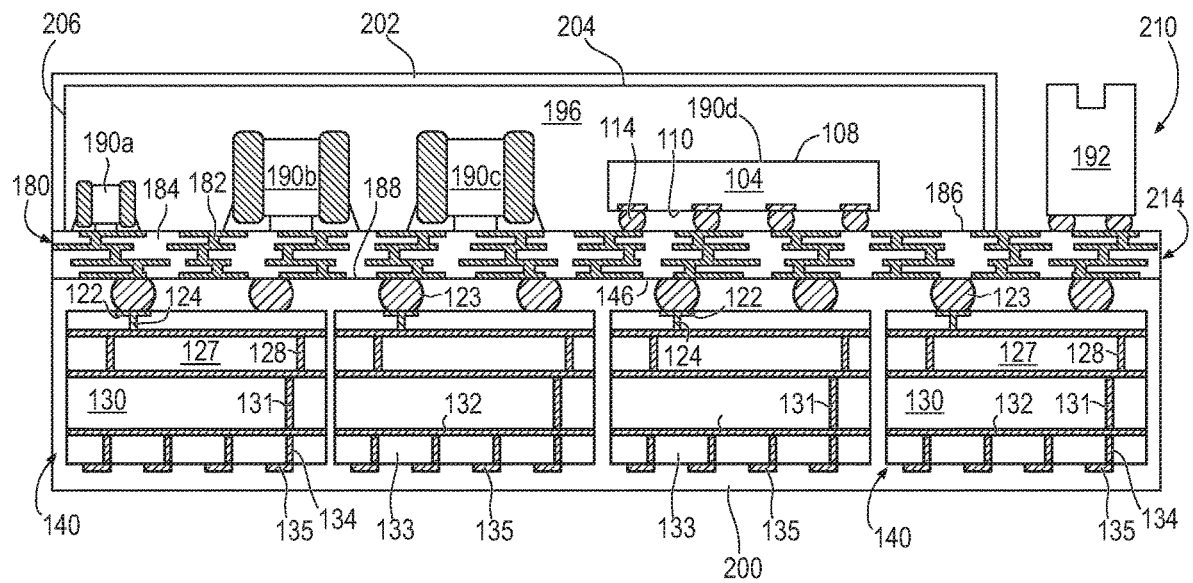

In FIG. 5e, electromagnetic shielding layer 202 is formed or disposed over surface 204 of encapsulant 196 by conformal application of shielding material. Shielding layer 202 can be one or more layers of Al, Cu, Sn, Ni, Au, Ag, or other suitable conductive material. Alternatively, shielding layer 202 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. In addition, shielding layer 202 covers side surfaces 206 of encapsulant 196, as well as the side surface of semiconductor package 210.

The combination of semiconductor package 210 and discrete RF antenna interposers 140 is designated as AoP 214. As integrated into AoP 214, discrete RF antenna interposers 140 provides the antenna function for RF electrical components 190a-190d in semiconductor package 210. Encapsulant 200 deposited around discrete RF antenna interposer 140 has a high Df and low Dk. The higher the value of Dk, the smaller the antenna patch width of conductive layer 135, and more antenna patches can be placed on AoP 214, as shown by equation (1).

Figure 6A:
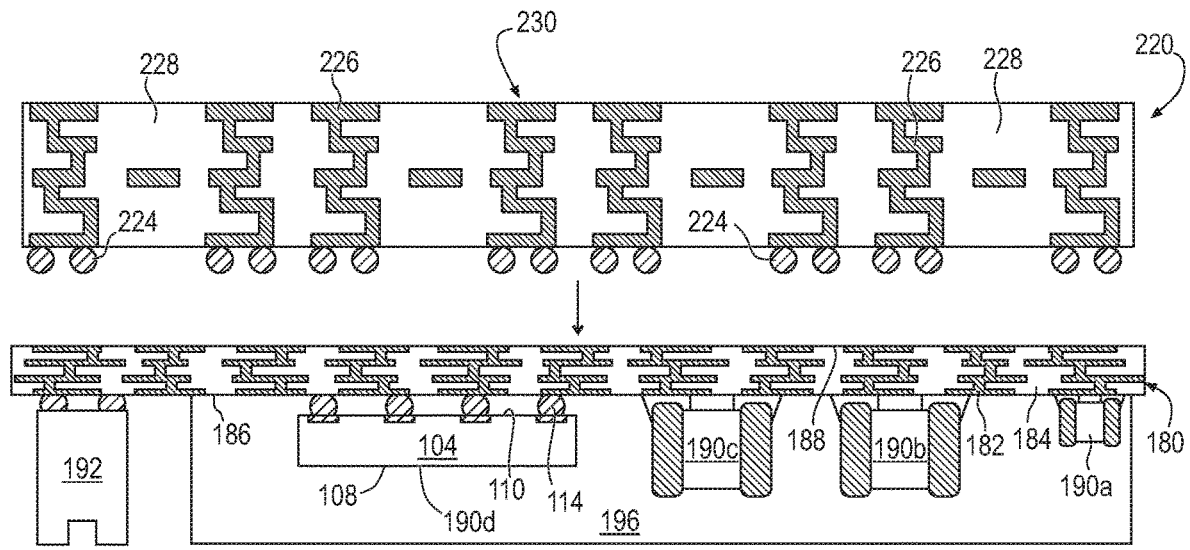
FIGS. 6a-6c illustrate a process of forming a semiconductor package with semiconductor die, interconnect substrate, and full width RF antenna substrate.

In another embodiment continuing from FIG. 3a or 5b, RF antenna substrate 220 is positioned over interconnect substrate 180 using a pick and place operation with bumps 224 oriented toward surface 188, as shown in FIG. 6a. Conductive layers 226 provide electrical interconnect, ground plane, and RF antenna, similar to conductive layers 122, 126, 129, 132, 135 in discrete RF antenna interposer 140. Insulating layers 228 provide isolation for conductive layers 226, similar to insulating layers 120, 127, 130, 133.

Figure 6B:
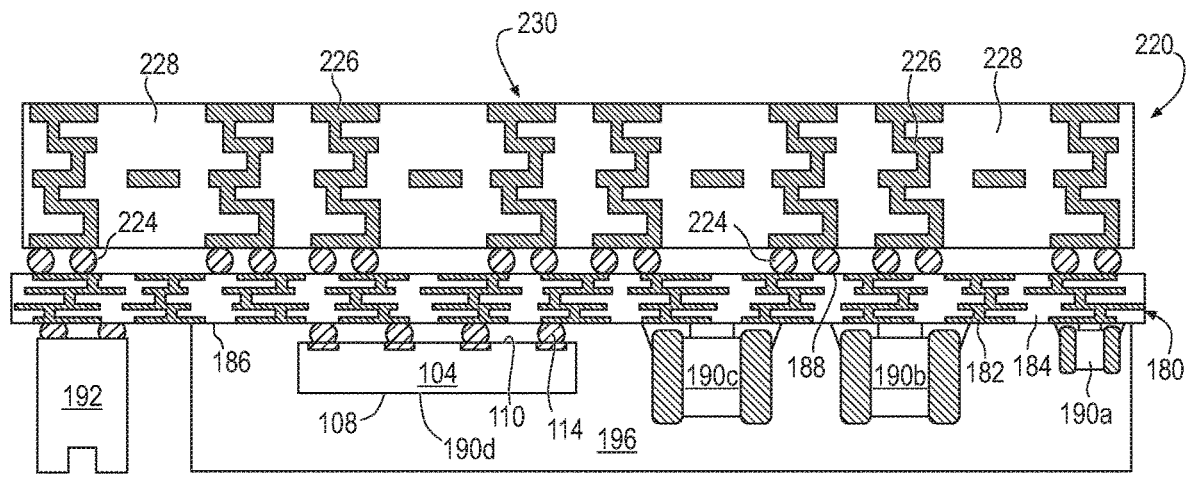

In this case, RF antenna substrate 220 functions as an RF antenna 230. Instead of multiple discrete RF antenna interposers 140, RF antenna substrate 220 is a single unitary body substantially covering interconnect substrate 180. RF antenna substrate 220 may have multiple RF antenna, similar to FIGS. 2d and 2e, to provide RF transmission and reception for multiple electrical components 190a-190d. FIG. 6b shows RF antenna substrate 220 mounted to interconnect substrate 180 with bumps 224 making mechanical and electrical connection to conductive layer 182.

Figure 6C:
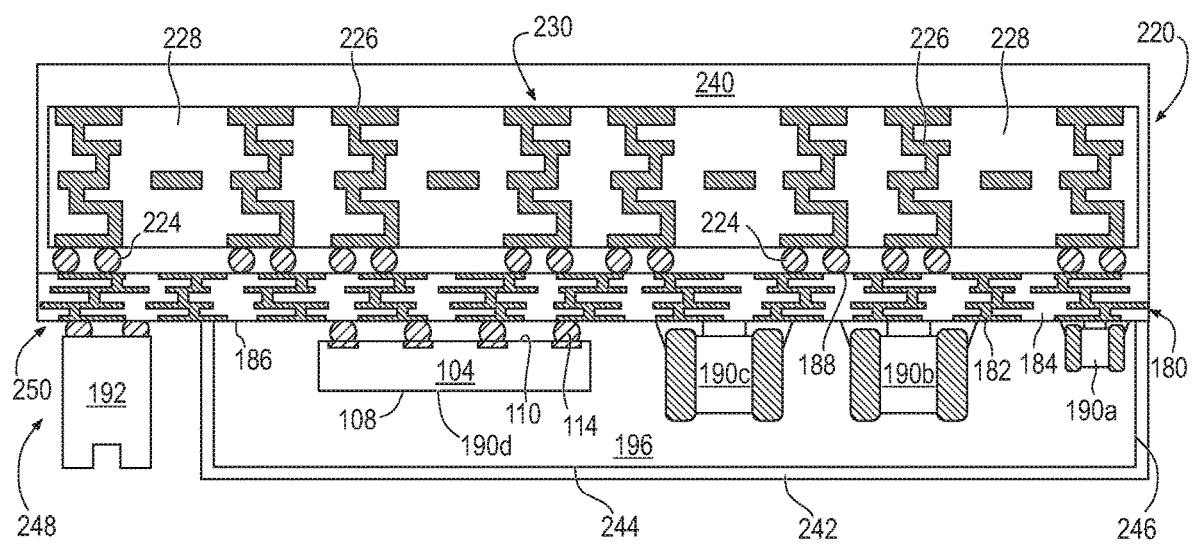

In FIG. 6c, an encapsulant or molding compound 240 is deposited over RF antenna substrate 220 and surface 188 of interconnect substrate 180 using a paste printing, compressive molding, transfer molding, liquid encapsulant molding, vacuum lamination, spin coating, or other suitable applicator. Encapsulant 240 can be polymer composite material, such as epoxy resin with filler, epoxy acrylate with filler, or polymer with proper filler. Encapsulant 240 is non-conductive, provides structural support, and environmentally protects the semiconductor device from external elements and contaminants. Encapsulant 240 has a high Dk and low Df. For example, encapsulant 240 has Dk of 14-21 and Df of 0.006~0.012 at 25 GHz. In any case, the Dk of encapsulant 240 is greater than the Dk of encapsulant 196 and insulating layers 120, 127, 130, and 133, and 144, respectively.

An electromagnetic shielding layer 242 is formed or disposed over surface 244 of encapsulant 196 by conformal application of shielding material. Shielding layer 242 can be one or more layers of Al, Cu, Sn, Ni, Au, Ag, or other suitable conductive material. Alternatively, shielding layer 242 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. In addition, shielding layer 242 covers side surfaces 246 of encapsulant 196, as well as the side surface of semiconductor package 248.

The combination of semiconductor package 248 and RF antenna substrate 220 is designated as AoP 250. As integrated into AoP 250, RF antenna substrate 220 provides the antenna function for RF electrical components 190a-190d in semiconductor package 248. Encapsulant 240 deposited around discrete RF antenna interposer 140 has a high Df and low Dk. The higher the value of Dk, the smaller the antenna patch width of conductive layer 226, and more antenna patches can be placed on AoP 250, as shown by equation (1).

Figure 7:
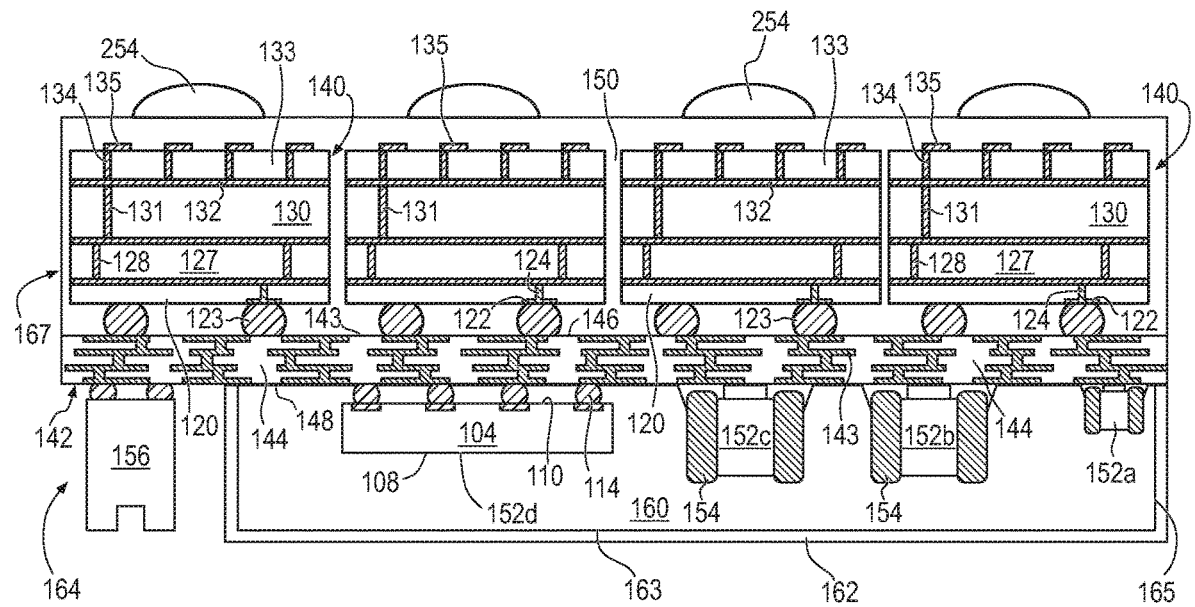
FIG. 7 illustrates the integrated RF antenna interposer and semiconductor package with encapsulant bumps on the encapsulation.

FIG. 7 shows an embodiment, similar to FIG. 3h, with encapsulant bumps 254 formed in encapsulant 150.

Figure 8:
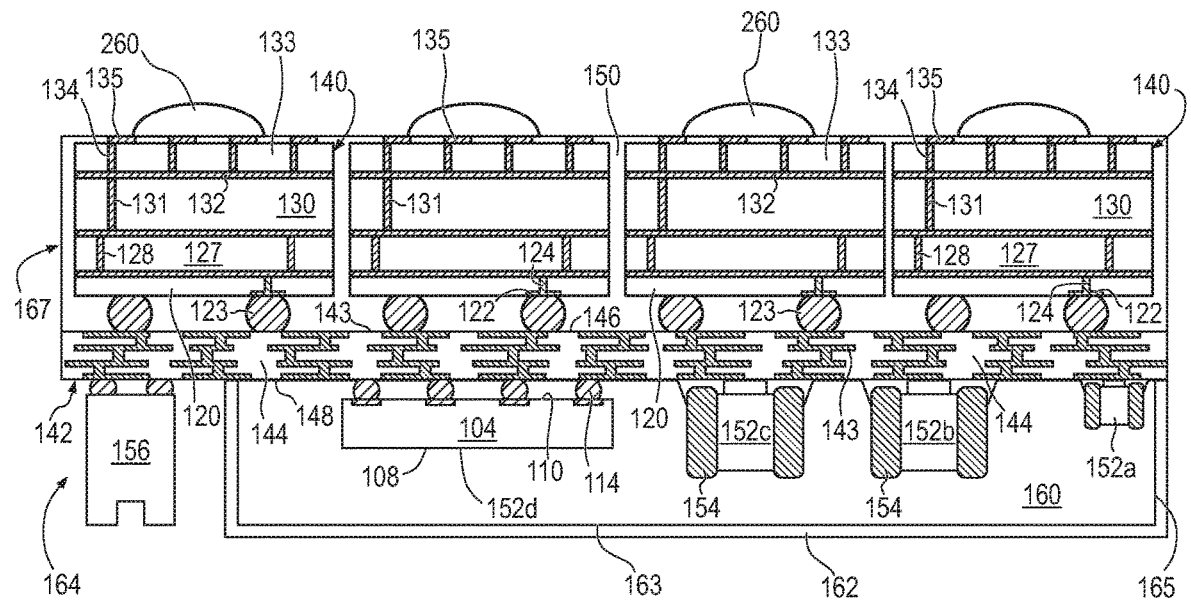
FIG. 8 illustrates the integrated RF antenna interposer and semiconductor package with encapsulant bumps on the RF antenna interposer.

FIG. 8 shows an embodiment, similar to FIG. 4b, with encapsulant bumps 260 formed in discrete RF antenna interposers 140.

Figure 9:
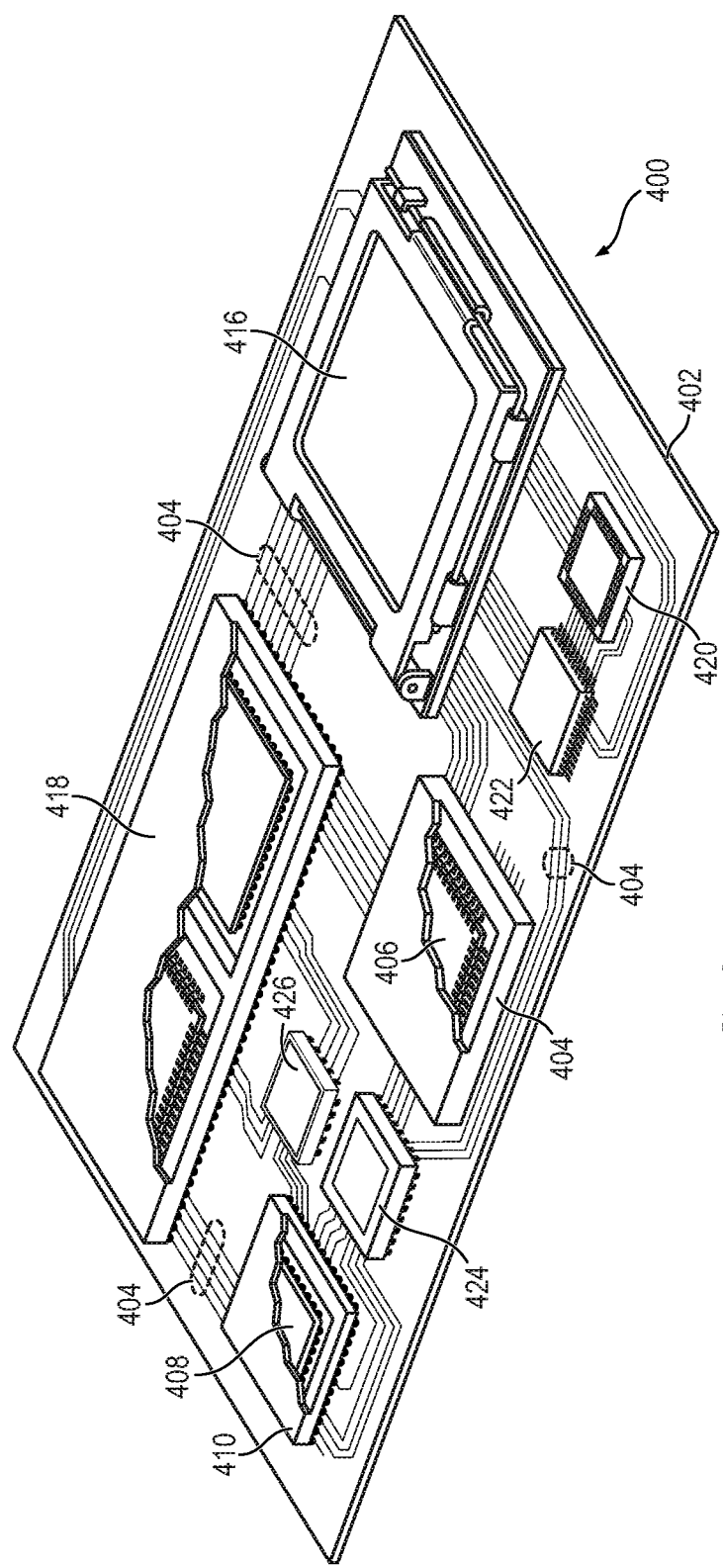
FIG. 9 illustrates a printed circuit board (PCB) with different types of packages mounted to a surface of the PCB.

FIG. 9 illustrates electronic device 400 having a chip carrier substrate or PCB 402 with a plurality of semiconductor packages mounted on a surface of PCB 402, including AoP 167, 214, and 250. Electronic device 400 can have one type of semiconductor package, or multiple types of semiconductor packages, depending on the application.

Electronic device 400 can be a stand-alone system that uses the semiconductor packages to perform one or more electrical functions. Alternatively, electronic device 400 can be a subcomponent of a larger system. For example, electronic device 400 can be part of a tablet, cellular phone, digital camera, communication system, or other electronic device. Alternatively, electronic device 400 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 9, PCB 402 provides a general substrate for structural support and electrical interconnect of the semiconductor packages mounted on the PCB. Conductive signal traces 404 are formed over a surface or within layers of PCB 402 using evaporation, electrolytic plating, electroless plating, screen printing, or other suitable metal deposition process. Signal traces 404 provide for electrical communication between each of the semiconductor packages, mounted components, and other external system components. Traces 404 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 406 and flipchip 408, are shown on PCB 402. Additionally, several types of second level packaging, including ball grid array (BGA) 410, bump chip carrier (BCC) 412, land grid array (LGA) 416, multi-chip module (MCM) or SIP module 418, quad flat non-leaded package (QFN) 420, quad flat package 422, embedded wafer level ball grid array (eWLB) 424, and wafer level chip scale package (WLCSP) 426 are shown mounted on PCB 402. In one embodiment, eWLB 424 is a fan-out wafer level package (Fo-WLP) and WLCSP 426 is a fan-in wafer level package (Fi-WLP). Depending upon the system requirements, any combination of semiconductor packages, configured with any combination of first and second level packaging styles, as well as other electronic components, can be connected to PCB 402. In some embodiments, electronic device 400 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a substrate;
an electrical component disposed over a first surface of the substrate;
a first encapsulant deposited over the electrical component;
a shielding layer disposed over the first encapsulant; and
an antenna interposer disposed over a second surface of the substrate opposite the first surface of the substrate, wherein the antenna interposer is a unitary body substantially covering the substrate.

2. The semiconductor device of claim 1, further including a second encapsulant deposited over the antenna interposer.

3. The semiconductor device of claim 2, wherein the second encapsulant comprises a high dielectric constant in the range of 14 to 21.

4. The semiconductor device of claim 2, wherein the first encapsulant comprises a low dielectric constant less than a high dielectric constant of the second encapsulant.

5. The semiconductor device of claim 2, further including an encapsulant bump disposed over the second encapsulant.

6. A semiconductor device, comprising:
a substrate;
an antenna interposer disposed over a first surface of the substrate, wherein the antenna interposer is a unitary body substantially covering the substrate;
an electrical component disposed over a second surface of the substrate opposite the first surface of the substrate;
a first encapsulant deposited over the electrical component;
a second encapsulant deposited over the antenna interposer; and
a shielding layer disposed over the first encapsulant.

7. The semiconductor device of claim 6, wherein the second encapsulant comprises a high dielectric constant in the range of 14 to 21.

8. The semiconductor device of claim 6, wherein the first encapsulant comprises a low dielectric constant less than a high dielectric constant of the second encapsulant.

9. The semiconductor device of claim 6, wherein the antenna interposer includes a conductive layer operating as an antenna and an insulating layer comprising a low dielectric constant less than a high dielectric constant of the second encapsulant.

10. The semiconductor device of claim 6, further including an encapsulant bump disposed over the second encapsulant.

11. A method of making a semiconductor device, comprising:
providing a substrate;
disposing an electrical component over a first surface of the substrate;
disposing a shielding layer over the electrical component; and
disposing an antenna interposer over a second surface of the substrate opposite the first surface of the substrate, wherein the antenna interposer is a unitary body substantially covering the substrate.

12. The method of claim 11, further including:
depositing a first encapsulant over the electrical component; and
depositing a second encapsulant over the antenna interposer.

13. The method of claim 12, wherein the second encapsulant comprises a high dielectric constant in the range of 14 to 21.

14. The method of claim 12, wherein the first encapsulant comprises a low dielectric constant less than a high dielectric constant of the second encapsulant.

15. The method of claim 12, further including disposing an encapsulant bump over the second encapsulant.

16. The method of claim 12, further including disposing the shielding layer disposed over the first encapsulant.

17. A method of making a semiconductor device, comprising:

- providing a substrate;
- disposing a shielding layer over the substrate; and
- disposing an antenna interposer over a first surface of the substrate, wherein the antenna interposer is a unitary body substantially covering the substrate.

18. The method of claim 17, further including:

- disposing an electrical component over a second surface of the substrate opposite the first surface of the substrate;
- depositing a first encapsulant over the electrical component; and
- depositing a second encapsulant over the antenna interposer.

19. The method of claim 18, wherein the second encapsulant comprises a high dielectric constant in the range of 14 to 21.

20. The method of claim 18, wherein the first encapsulant comprises a low dielectric constant less than a high dielectric constant of the second encapsulant.

21. The method of claim 18, further including disposing an encapsulant bump over the second encapsulant.

22. The method of claim 18, further including disposing the shielding layer over the first encapsulant.

* * * * *